(12) United States Patent
Lee et al.

(10) Patent No.: US 7,148,574 B2
(45) Date of Patent: Dec. 12, 2006

(54) BONDING PAD STRUCTURE AND METHOD OF FORMING THE SAME

(75) Inventors: Jian-Hsing Lee, Pu-Tzu (TW); Pao-Kang Niu, Hsinchu (TW); Ko-Yi Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 106 days.

(21) Appl. No.: 10/824,035

(22) Filed: Apr. 14, 2004

(65) Prior Publication Data

US 2005/0230847 A1    Oct. 20, 2005

(51) Int. Cl.
*H01L 23/48* (2006.01)

(52) U.S. Cl. .................... 257/773; 257/786

(58) Field of Classification Search ............ 257/698, 257/758, 773, 780, 781, 786
See application file for complete search history.

(56) References Cited

U.S. PATENT DOCUMENTS

| 5,736,791 | A | 4/1998 | Fujiki et al. ............... 257/781 |
| 5,739,587 | A | 4/1998 | Sato ........................ 257/758 |
| 6,028,367 | A | 2/2000 | Yu .......................... 257/780 |
| 6,762,466 | B1 * | 7/2004 | Huang et al. ............... 257/395 |
| 2002/0135032 | A1 | 9/2002 | Kwon ....................... 257/408 |

* cited by examiner

*Primary Examiner*—Hung Vu
(74) *Attorney, Agent, or Firm*—Thomas, Kayden, Horstemeyer & Risley

(57) ABSTRACT

A bonding pad structure and fabrication method thereof. A bonding pad is substantially surrounded and insulated by a dielectric layer, wherein the bonding pad is formed of at least one first conductive layer having a wiring layer with a stripe layout and a first edge portion, a second conductive layer having a wire bonding portion and a second edge portion and a plurality of plugs electrically connecting the wiring layer and the wire bonding portion. A conductive structure of an array of metal plugs or a metal damascene structure is formed to connect the first edge portion and the second edge portion, thereby preventing burn out of the first edge portion during an ESD event.

13 Claims, 10 Drawing Sheets

BONDING PAD STRUCTURE AND METHOD OF FORMING THE SAME

BACKGROUND OF THE INVENTION

1. Field of the Invention

The present invention relates to a bonding pad structure for a semiconductor circuit and a method of forming the same, and more particularly, to a bonding pad structure that resists electrostatic discharge (ESD) damage and a method of forming the same.

2. Description of the Related Art

Bonding pads are the interfaces between the integrated circuits contained in semiconductor chips and the chip package. A large number of bonding pads are required to transmit power/ground and input/output signals to the chip devices. It is thus important that the bonding pad yield be sufficiently high to ensure a higher yield.

The general bonding pad structure consists of metal layers emanating from the terminals of the chip devices and separated by IMD (intermetal dielectric) layers that typically comprise silicon oxide. An IMD layer separates the uppermost metal layer from a bonding pad pattern formed on the IMD layer. Metal plugs pass through the IMD layers connecting the metal layers to the metal bonding pattern. Wires are bonded to the metal bonding pattern and to the chip package forming electrical connections between the chip and the package. A passivation layer covers the surface, except over bonding sites, sealing the chip to protect it from contaminants and scratches.

A bonding pad structure having slotted metal layers has recently been disclosed in U.S. Pat. No. 5,736,791, for example. FIG. 1 schematically shows the conventional bonding pad structure. The conventional pad structure containing a bonding metal layer 11 and a multiplicity of first metal layers 12 and second metal layers 13, wherein IMD levels 15 separate metal layers 11, 12 and 13. Metal plugs 16 pass through the IMD levels 15 connecting the metal layers 12 and 13 to the bonding metal layer 11. FIG. 2A shows a layout pattern (a top plan view) of the first metal layer 12. The first metal layer 12 has a first wiring layer 22 with a stripe layout, wherein elongated rectangular first slot portions 24 are formed through the first wiring layer 22. FIG. 2B shows a layout pattern (a top plan view) of the second metal layer 13. The second metal layer 13 has a second wiring layer 23 with a stripe layout, wherein elongated rectangular second slot portions 25 are formed through the second wiring layer 23. It is noted that the direction of the first wiring layer 22 is perpendicular to that of the second wiring layer 23. Also, the metal plugs 16 are located at the intersecting points of the first and second wiring layers 22 and 23.

The conventional bonding pad structure can prevent the dielectric layer from cracking, but does not address potential electrostatic discharge (ESD) damage. ESD can occur when electrostatic charge accumulates. This can occur whenever semiconductor devices are handled or for various other reasons. Input/output pads (also referred to as bonding pads) are particularly vulnerable to ESD. ESD can potentially result in the destruction of the conventional pad structure when the high ESD current (e.g. >2 amp.) flows into the edge portion of the conventional pad structure, thereby seriously degrading the device performance.

FIG. 3 depicts an ESD event occurring at the edge portion of the conventional pad structure. For example, an ESD protection device 30 is connected to one side of the first metal layer 12. When the ESD current, represented by arrows 32, flows into the edge portion 34 of the first metal layer 12 of the conventional pad structure, the edge portion 34 is easily damaged by ESD.

In U.S. Pat. No. 5,736,791, Noriaki et al disclose a bonding pad structure utilizing via holes and slots formed in metal layers. This pad structure is generally referred to as a slotted pad structure. The slots of the pad structure are resistant to cracks caused during wire bonding. Though effective, this structure cannot sustain high ESD current.

In U.S. Pat. No. 5,739,587, Sato et al disclose a bonding pad structure containing via holes or grooves which prevent moisture from entering device areas. This bonding pad structure does not utilize slots formed in metal layers. Additionally, this structure does not teach how to sustain high ESD current during an ESD event.

In U.S. Pat. No. 6,028,367, Chen discloses a bonding pad structure for improving heat conductance. This structure includes a bonding pad substantially surrounded and insulated by an IMD layer and formed of two metal layers and metal via plugs connected therebetween, and a heat dissipating ring surrounding and spaced-apart from the bonding pad. This bonding pad structure does not utilize slots. Moreover, this structure does not teach how to sustain high ESD current during an ESD event.

In U.S. Patent application publication No. 2002/0135032, Kwon discloses a semiconductor device for ESD protection. This device includes a plurality of transistors having a multi-fingered structure, a plurality of multilayer interconnections separated from one another formed in proportion to the number of common drain regions of the transistors and connected to the common drain regions of each transistor, a pad conductive layer formed on the multilayer interconnections, and a plurality of contact plugs for connecting multilayer interconnections to one another and for connecting the multilayer interconnections to the pad conductive layer so that a current flowing through the common drain regions of the transistors only passes through the multilayer interconnections connected to the common drain regions and may flow into the pad conductive layer. The bonding pad structure of this semiconductor device, however, utilizes slots formed in each metal layer. Additionally, it does not teach how to sustain high ESD current during an ESD event.

SUMMARY OF THE INVENTION

An object of the present invention is to provide a bonding pad structure that is immune to burn out, and capable of withstanding ESD current encountered during an ESD event.

Another object of the present invention is to provide a method of forming a bonding pad structure with plugs in the edge portion thereof.

In order to achieve these objects, the present invention provides a bonding pad structure for ESD improvement. A bonding pad is substantially surrounded and insulated by a dielectric layer. The bonding pad comprises at least one first conductive layer having a wiring layer with a stripe layout and a first edge portion, a second conductive layer having a wire bonding portion and a second edge portion and a plurality of plugs electrically connecting the wiring layer and the wire bonding portion. A conductive structure connects the first edge portion and the second edge portion, thereby preventing the first edge portion from burn out during an ESD event.

The present invention also provides a method of forming a bonding pad structure for improving ESD protection. A substrate having an interlevel dielectric (ILD) layer thereon is provided. A bonding pad is formed on the ILD layer. An intermetal dielectric (IMD) layer is formed to surround and insulate the bonding pad, wherein the bonding pad is formed of at least one metal layer having a wiring layer with a stripe layout and a first edge portion, a bonding metal layer having a wire bonding portion and a second edge portion and a plurality of plugs electrically connecting the wiring layer and the wire bonding portion. A conductive structure of an array of metal plugs or a metal damascene structure is formed to connect the first edge portion and the second edge portion, thereby preventing the first edge portion from burn out during an ESD event.

The present invention improves on the conventional technology in that the edge portion of the present bonding pad structure has a conductive structure connected between adjacent metal layers. Thus, the conductive structure can resist destruction of the edge portion of the bonding pad structure due to the ESD current. Moreover, the additional conductive structure can be simultaneously formed during formation of the plugs. The conductive structure of the bonding pad can effectively prevent ESD damage, thereby improving device reliability and ameliorating the disadvantages of the conventional technology.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Figure 1:
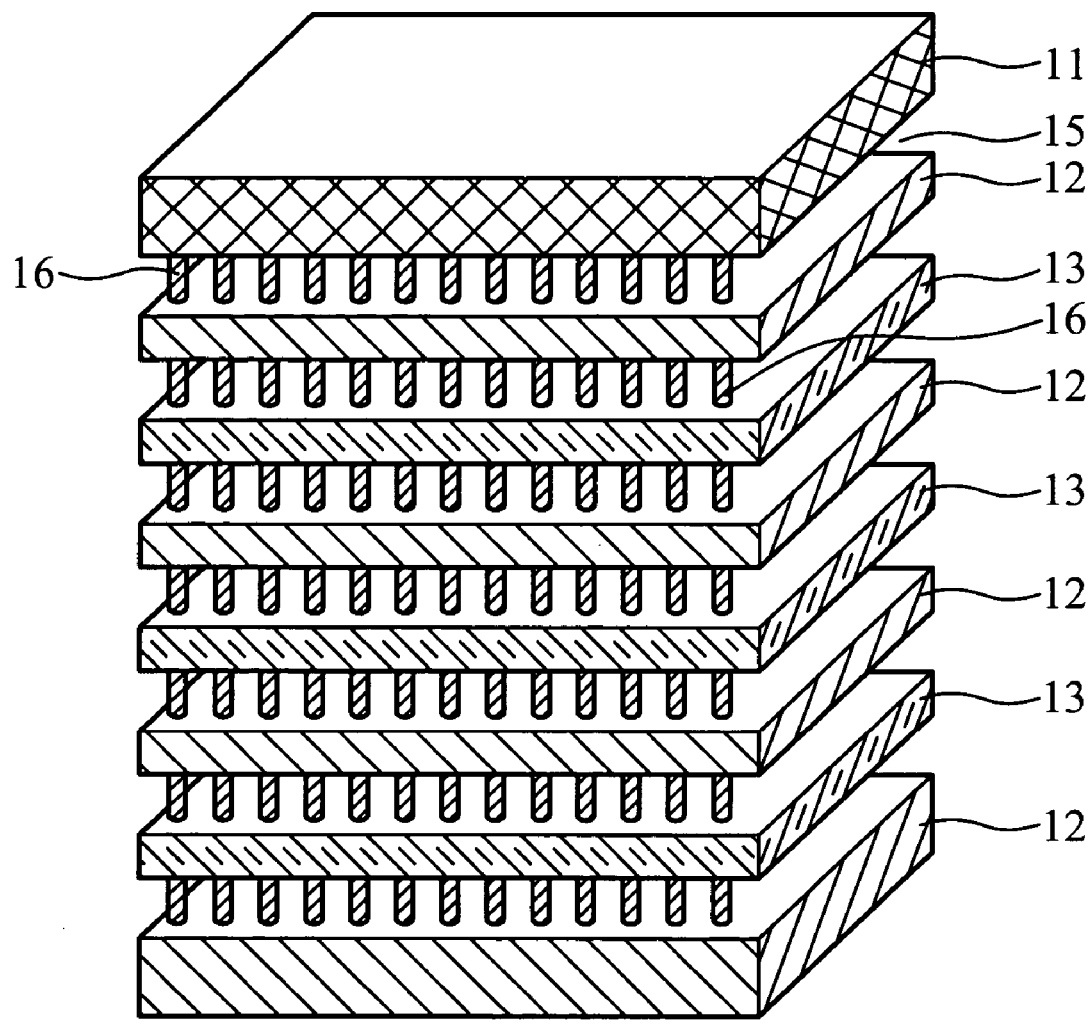
FIG. 1 schematically shows a conventional bonding pad structure having multilevel metal layers.
Figure 2A:
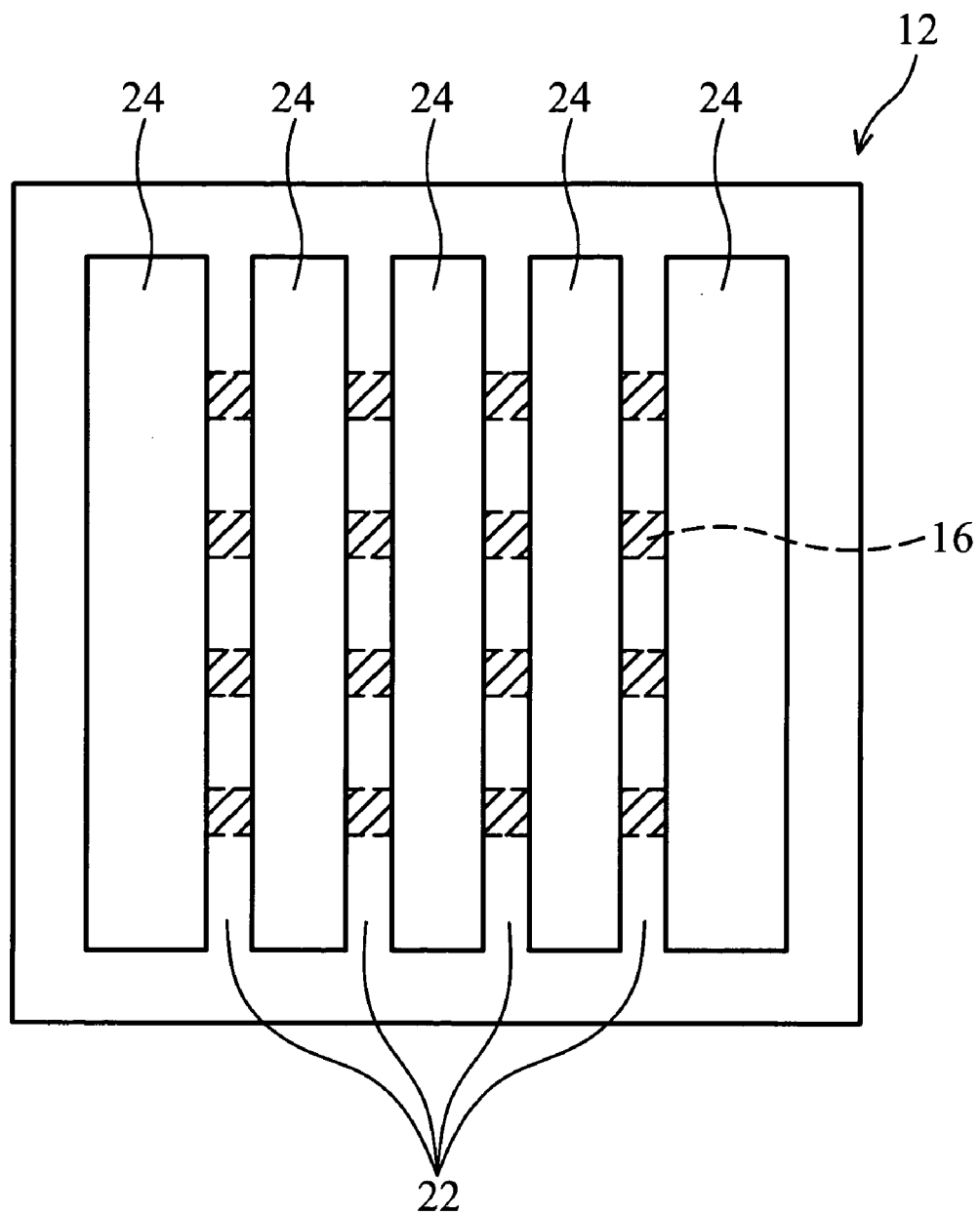
FIG. 2A shows a layout pattern (a top plan view) of a first metal layer (12) of the conventional bonding pad structure shown in FIG. 1.
Figure 2B:
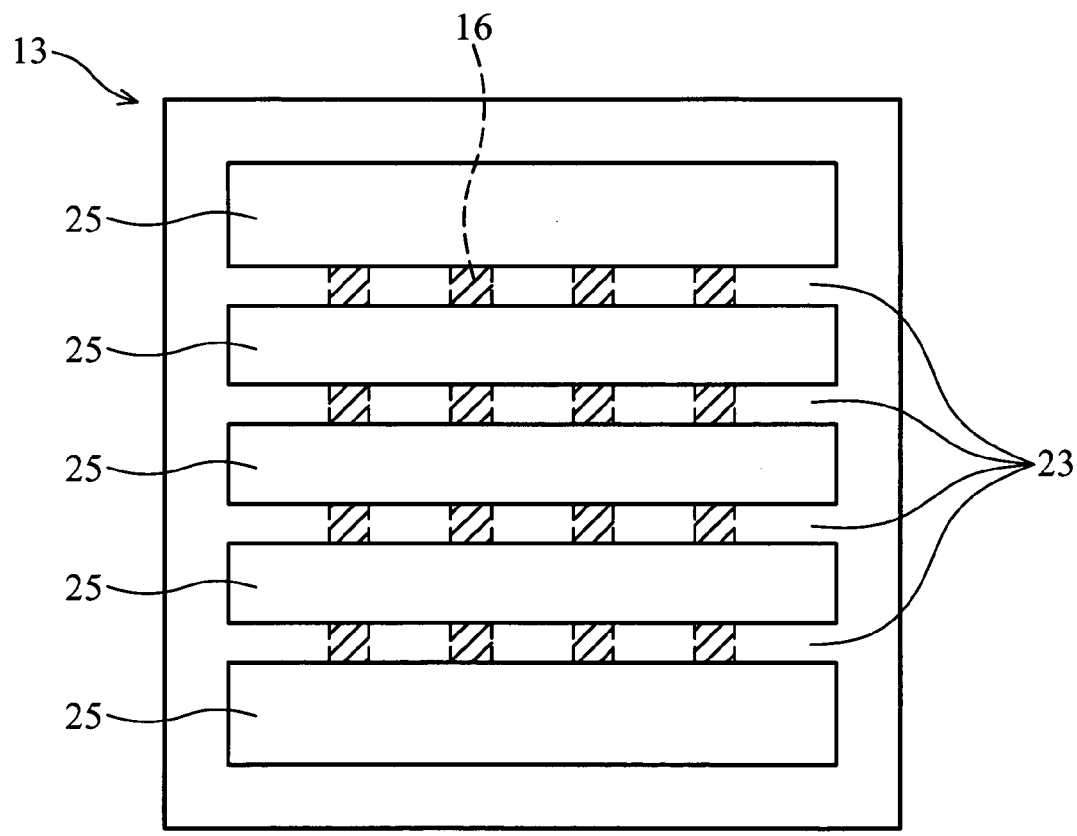
FIG. 2B shows a layout pattern (a top plan view) of a second metal layer (13) of the conventional bonding pad structure shown in FIG. 1.
Figure 3:
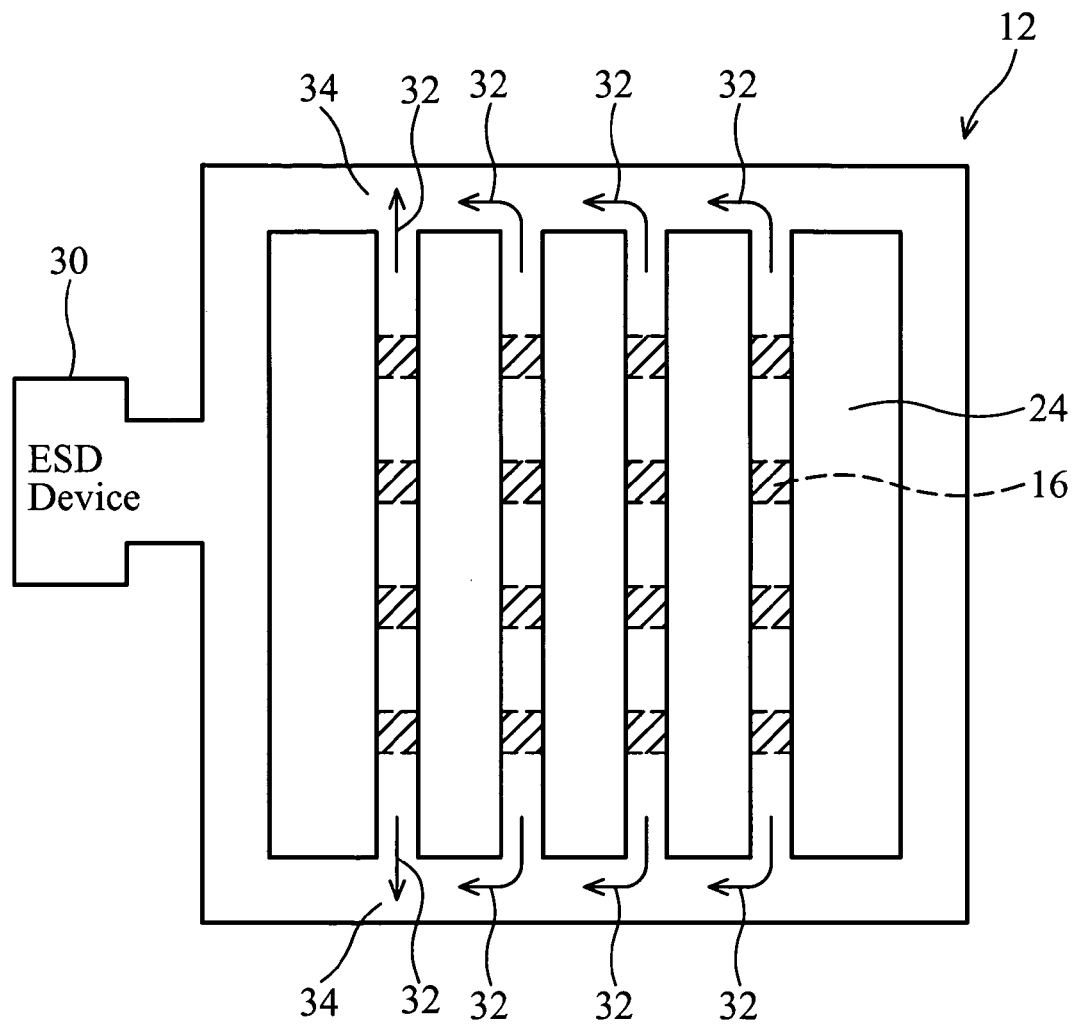
FIG. 3 shows the problem of burn out at the edge portion of the conventional bonding structure.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 4:
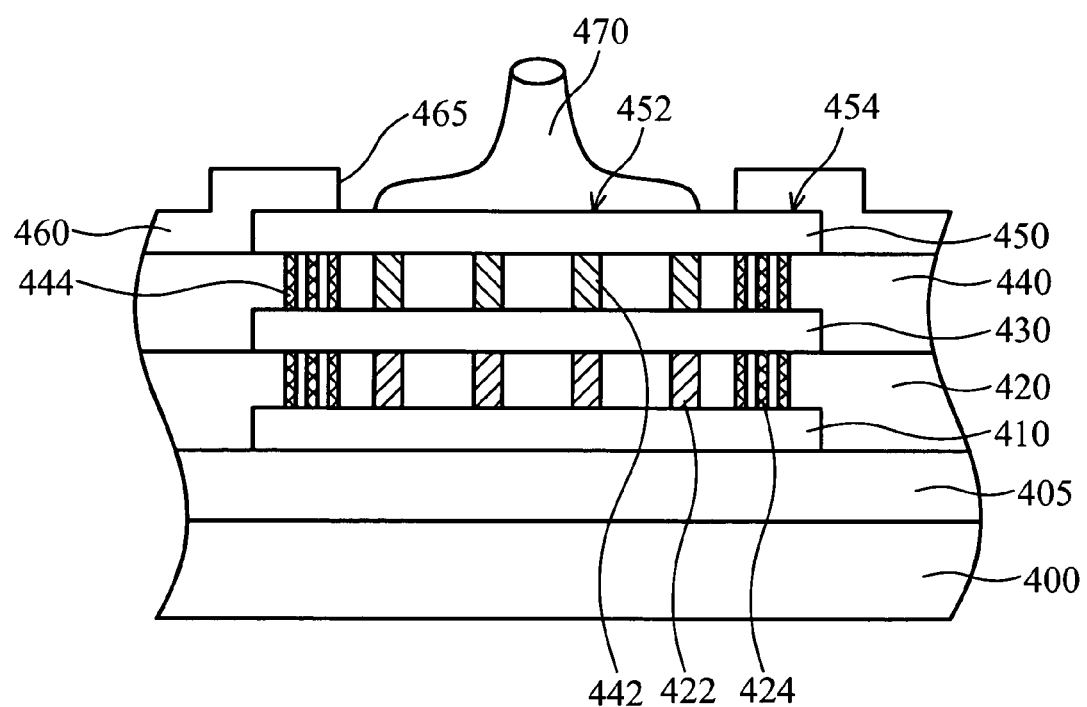
FIG. 4 shows a sectional view of a bonding pad structure according to a first embodiment of the present invention.

FIG. 4 shows a sectional view of a bonding pad structure according to a first embodiment of the present invention.

A semiconductor substrate 400 may be a silicon substrate comprising any devices (e.g. MOS and diode, not shown). An interlevel dielectric (ILD) layer 405 overlies the substrate 400. The ILD layer 405 can be a $SiO_2$ or BPSG (borophosphosilicate glass) layer formed by CVD (chemical vapor deposition). A first metal layer 410 overlies part of the ILD layer 405.

Figure 5A:
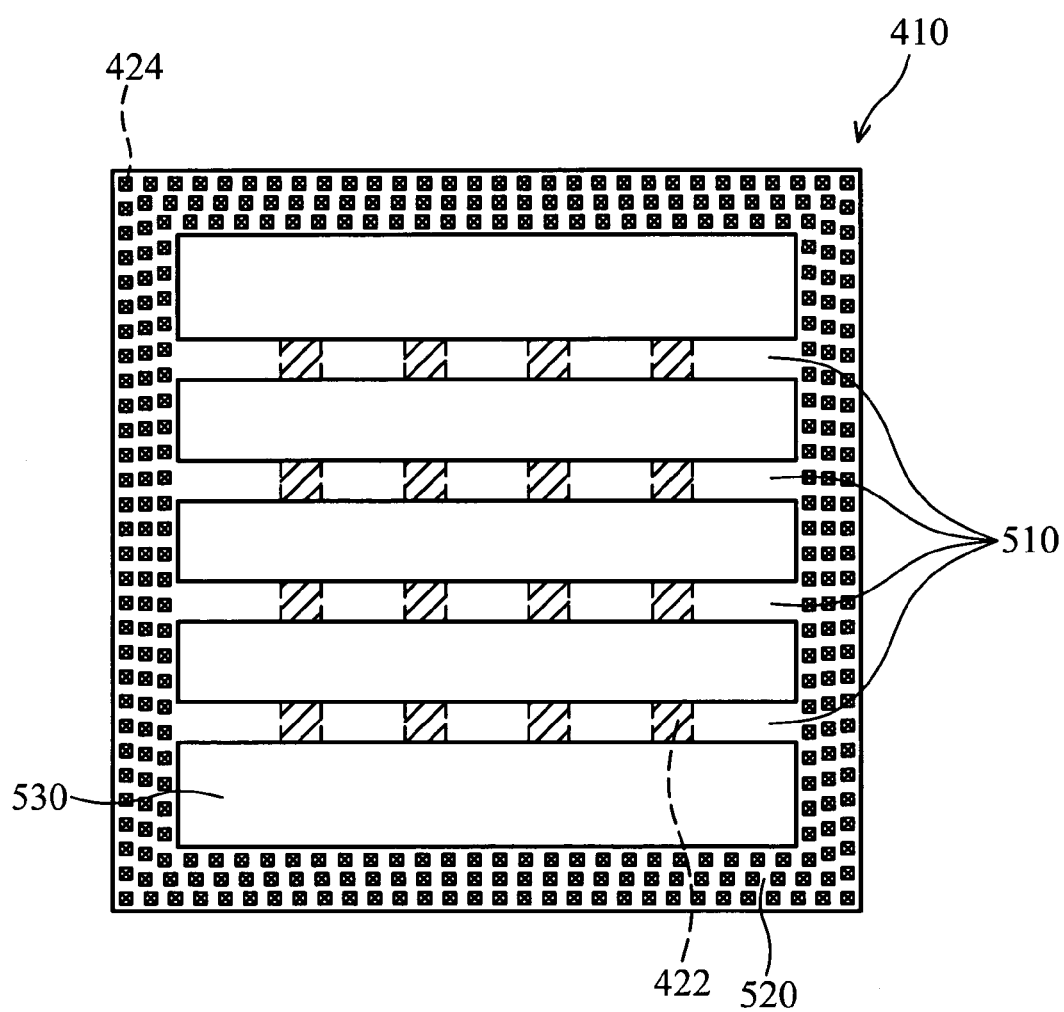
FIG. 5A shows a layout pattern (a top plan view) of a metal layer of the bonding pad structure shown in FIG. 4.

A process for forming at least one level of interconnection follows, but this is not intended to limit the present invention. The first metal layer 410, such as a Cu, Al, AlCu or AlSiCu interconnection, is formed on the ILD layer 405 by sputtering and patterning. The layout pattern (a top plan view) of the first metal layer 410 is a grid pattern shown in FIG. 5A, in which elongated rectangular slot portions 530 are formed through the first metal layer 410. This pattern is referred to as a slotted metal layer. The first metal layer 410 comprises a first wiring layer 510 with a stripe layout and a first edge portion 520 (or a peripheral region). The width of the first edge portion 520 can be about 5 μm.

In FIG. 4, a first intermetal dielectric (IMD) layer 420 having first and second plugs 422 and 424 overlies the first metal layer 410. The formation of the first IMD layer 420 is described in the following. The first IMD layer 420 can be $SiO_2$, SiN or SiON layer formed by, for example, CVD or coating. Preferably, a low dielectric constant material, such as FSG (fluorinated silica glass), HSQ (hydrogen silsequioxane) or MSQ (methyl silsequioxane), is employed to serve as the material of the first IMD layer 420. Subsequent to formation of the first IMD layer 420, a planarization procedure, such as CMP (chemical mechanical polishing) or etching-back, can be performed to obtain a smooth surface.

A resist (not shown) is next applied on the first IMD layer 420, which is patterned with photolithography to form a via hole pattern followed by etching of the first IMD layer 420 to form openings using the resist as a mask by means of RIE (reactive ion etching). The resist is then removed by, for example, oxygen plasma to obtain the via hole pattern. The via hole pattern is then filled with a conductive material, such as W, Al or Cu, to form the first and second plugs 422 and 424. That is, the first plugs 422 and the second plugs 424 can be simultaneously formed. It is noted that the first plugs 422 connect to the first wiring layer 510 with a stripe layout and the second plugs 424 connect to the first edge portion 520 of the first metal layer 410. The second plugs 424 can form an array of second plugs 424, as shown as FIG. 5A. The size of each second plug 424 may be 0.2 μm*0.2 μm square.

A second metal layer 430 overlies the first IMD layer 420 above the first metal layer 410. The second metal layer 430 can be a Cu, Al, AlCu or AlSiCu interconnection formed by sputtering and patterning. The second metal layer 430 connects the first and second plugs 422 and 424. The layout pattern (a top plan view) of the second metal layer 430 is a grid shown in FIG. 5B, in which elongated rectangular slot portions 535 are formed through the second metal layer 430. The direction of the stripes of the first metal layer 410 can be approximately perpendicular to those of the second metal layer 430. The second metal layer 430 comprises a second wiring layer 515 with a stripe layout and a second edge portion 525. The width of the second edge portion 525 can be about 5 μm. An ESD protection device 810 electrically connects the first metal layer 410 or the second metal layer 430. In this case, the ESD protection device 810 electrically connects the second metal layer 430.

A second intermetal dielectric (IMD) layer 440 having third and fourth plugs 442 and 444 overlies the second metal layer 430. The formation of the second IMD layer 440 is described in the following. The second IMD layer 440 can be a $SiO_2$, SiN or SiON layer formed by, for example, CVD or coating. Preferably, a low dielectric constant material, such as FSG (fluorinated silica glass), HSQ (hydrogen silsequioxane) or MSQ (methyl silsequioxane), is employed to serve as the material of the second IMD layer 440. Subsequent to the formation of the second IMD layer 440, a planarization procedure, such as CMP (chemical mechanical polishing) or etching-back, can be performed to obtain a smooth surface.

A resist (not shown) is next applied on the second IMD layer 440, which is patterned with photolithography to form a via hole pattern followed by etching of the second IMD layer 440 to form openings using the resist as a mask by means of RIE (reactive ion etching). The resist is then removed by, for example, oxygen plasma to obtain the via hole pattern. The via hole pattern is then filled with a conductive material, such as W, Al or Cu, to form the third and fourth plugs 442 and 444. That is, the third plugs 442 and fourth plugs 444 can be simultaneously formed. It is noted that the third plugs 442 connect to the second wiring layer 515 with a stripe layout and the fourth plugs 444 connect to the second edge portion 525 of the second metal layer 430. The fourth plugs 444 can form an array of fourth plugs 444, as shown as FIG. 5B. The size of each fourth plug 444 may be 0.2 μm*0.2 μm square.

It should be noted that the IMD layer can comprise single level or multiple levels to surround and isolate the metal interconnection(s). For example, if the device was fabricated using three metal level processes, then a separate IMD layer would exist for each of the three metal levels (not shown). In order to simplify the illustration of the present invention, only two IMD levels 420 and 440 and two metal interconnections 410 and 430 are shown in FIG. 4, but this is not intended to limit the present invention.

In FIG. 4, a bonding metal layer 450 comprising a wire bonding portion 452 and an edge portion 454 is defined on the second IMD layer 440 above the second metal layer 430. The bonding metal layer 450 can be a Cu, Al, AlCu or AlSiCu layer formed by deposition. The bonding metal layer 450 connects the third and fourth plugs 442 and 444. A bonding pad structure of the present invention is thus obtained.

A passivation layer 460 overlies the surfaces of the bonding metal layer 450 and the IMD layer 440. The passivation layer 460 can be a SiN or SiON layer formed by CVD. An opening 465 is then formed to expose the wire bonding portion 452 by photolithography and etching. Finally, a wire 470 (or a test fixture) is bonded to the wire bonding portion 452 of the bonding metal layer 450.

According to the first embodiment of the invention, referring to FIG. 4, the passages for flowing ESD current are not only the known plugs (422/442) connecting the wiring layer (510/515) with a stripe layout, but also the conductive structure (i.e. the plugs 424/444) connecting the edge portion (520/525) of the metal layer (410/430/450). Thus, the present bonding pad structure can prevent burn out of the edge portion of the conventional slotted metal layer during an ESD event.

Second Embodiment

Figure 6:
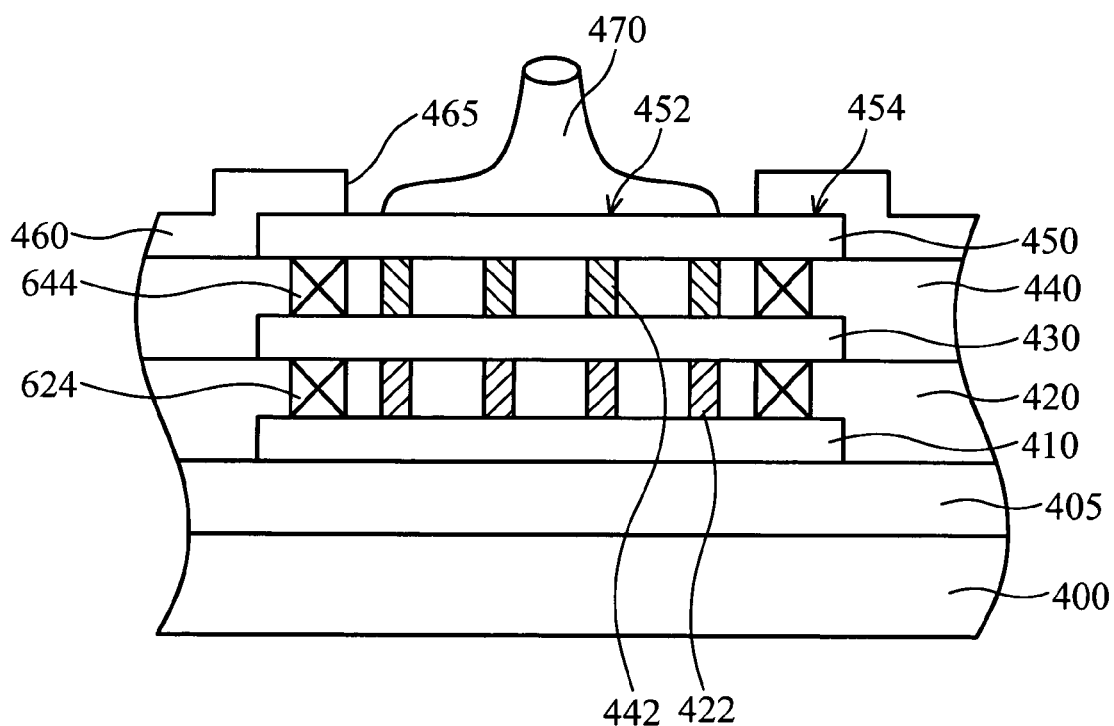
FIG. 6 shows a sectional view of a bonding pad structure according to a second embodiment of the present invention.

FIG. 6 shows a sectional view of a bonding pad structure according to a second embodiment of the present invention. The main difference between the first and second embodiments is the conductive structure connecting the edge portion of the metal layer.

A substrate 400 may be a silicon substrate comprising any devices (not shown). An interlevel dielectric (ILD) layer 405 overlies the substrate 400. The ILD layer 405 can be a SiO$_2$ or BPSG (borophosphosilicate glass) layer formed by CVD (chemical vapor deposition). A first metal layer 410 overlies part of the ILD layer 405.

Figure 7A:
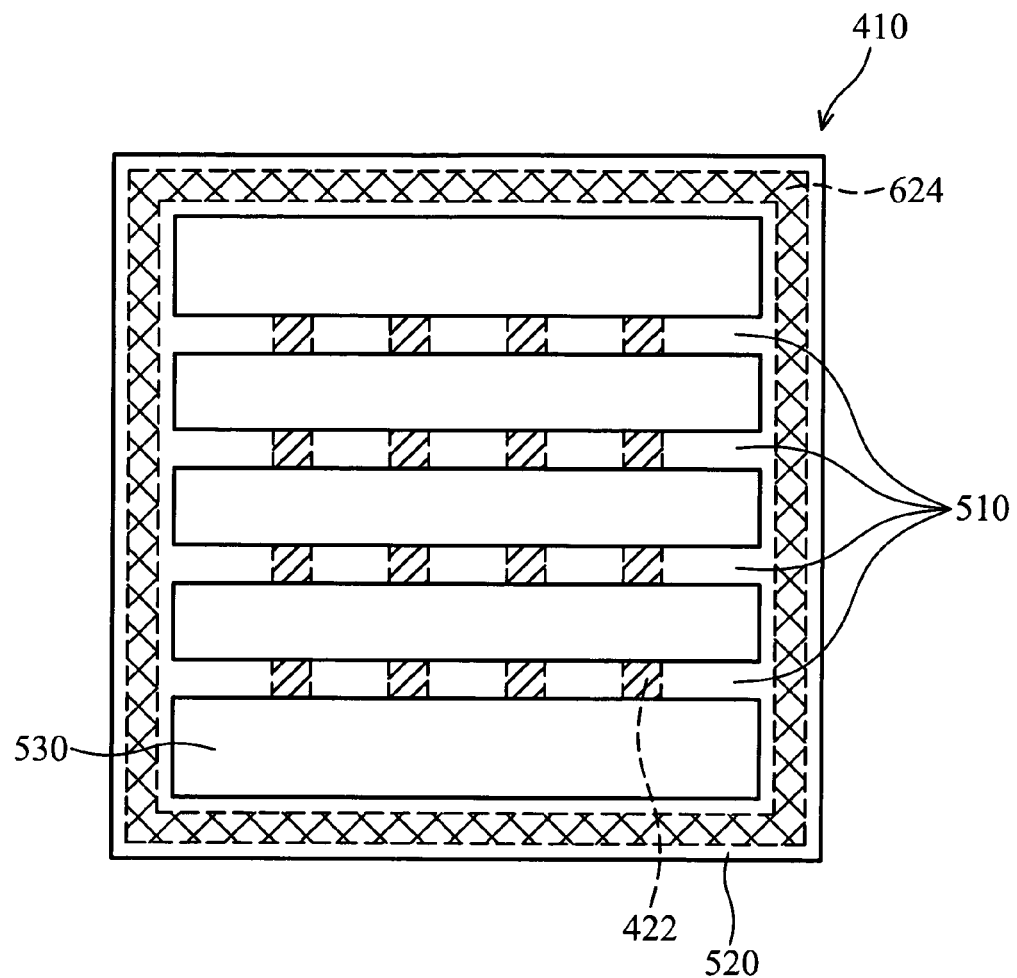
FIG. 7A shows a layout pattern (a top plan view) of a metal layer of the bonding pad structure shown in FIG. 6.

A process for forming at least one level of interconnection follows, but this is not intended to limit the present invention. A first metal layer 410, such as a Cu, Al, AlCu or AlSiCu interconnection, is formed on the ILD layer 405 by sputtering and patterning. The layout pattern (a top plan view) of the first metal layer 410 is a grid pattern shown in FIG. 7A, in which elongated rectangular slot portions 530 are formed through the first metal layer 410. This pattern is referred to as a slotted metal layer. The first metal layer 410 has a first wiring layer 510 with a stripe layout and a first edge portion 520 (or a peripheral region). The width of the first edge portion 520 can be about 5 μm.

In FIG. 4, a first intermetal dielectric (IMD) layer 420 having first plugs 422 and a first metal damascene structure 624 overlies the first metal layer 410. Formation of the first IMD layer 420 is described in the following. The first IMD layer 420 can be a SiO$_2$, SiN or SiON layer formed by CVD or coating. Preferably, a low dielectric constant material, such as FSG (fluorinated silica glass), HSQ (hydrogen silsequioxane) or MSQ (methyl silsequioxane), is employed to serve as the material of the first IMD layer 420. Subsequent to the formation of the first IMD layer 420, a planarization procedure, such as CMP (chemical mechanical polishing) or etching-back, can be performed to obtain a smooth surface.

A resist (not shown) is next applied on the first IMD layer 420, which is patterned with photolithography to form a via hole pattern followed by etching of the first IMD layer 420 to form openings using the resist as a mask by means of RIE (reactive ion etching). The resist is then removed by, for example, oxygen plasma to obtain the via hole pattern. The via hole pattern is then filled with a conductive material, such as W, Al or Cu, to form first plugs 422 and the first metal damascene structure 624. That is, the first plugs 422 and the first metal damascene structure 624 can be simultaneously formed. It is noted that the first plugs 422 connect to the first wiring layer 510 with a stripe layout and the first metal damascene structure 624 connects to the first edge portion 520 of the first metal layer 410. The first metal damascene structure 624 can be formed along the first edge portion 520, as shown as FIG. 7A. The width of the first metal damascene structure 624 can be about 1~3 μm.

A second metal layer 430 overlies the first IMD layer 420 above the first metal layer 410. The second metal layer 430 can be a Cu, Al, AlCu or AlSiCu interconnection formed by sputtering and patterning. The second metal layer 430 connects the first plugs 422 and the first metal damascene structure 624. The layout pattern of the second metal layer 430 is a grid pattern shown in FIG. 7B, in which elongated rectangular slit portions 535 are formed through the second metal layer 430. The direction of the stripes of the first metal layer 410 can be approximately perpendicular to those of the second metal layer 430. The second metal layer 430 comprises a second wiring layer 515 with a stripe layout and a second edge portion 525. An ESD protection device 810 electrically connects to the first metal layer 410 or the second metal layer 430. In this case, the ESD protection device 810 electrically connects to the second metal layer 430.

A second intermetal dielectric (IMD) layer 440 having second plugs 442 and the second metal damascene structure 644 overlies the second metal layer 430. The formation of the second IMD layer 440 is described in the following. The second IMD layer 440 can be a SiO$_2$, SiN or SiON layer formed by CVD or coating. Preferably, a low dielectric constant material, such as FSG (fluorinated silica glass), HSQ (hydrogen silsequioxane) or MSQ (methyl silsequioxane), is employed to serve as the material of the first IMD layer 430. Subsequent to the formation of the second IMD layer 430, a planarization procedure, such as CMP (chemical mechanical polishing) or etching-back, can be performed to obtain a smooth surface.

A resist (not shown) is next applied on the second IMD layer 440, which is patterned with photolithography to form a via hole pattern followed by etching of the second IMD layer 440 to form openings using the resist as a mask by means of RIE (reactive ion etching). The resist is then removed by, for example, oxygen plasma to obtain the via hole pattern. The via hole pattern is then filled with a conductive material, such as W, Al or Cu, to form second plugs 442 and a second metal damascene structure 644. That is, the second plugs 442 and the second metal damascene structure 644 can be simultaneously formed. It is noted that the second plugs 442 connect to the second wiring layer 515 with a stripe layout and the second metal damascene structure 644 connects to the second edge portion 525 of the second metal layer 430. The second metal damascene structure 644 can be formed along the second edge portion 525, as shown as FIG. 7B. The width of the second metal damascene structure 644 can be about 1~3 µm.

It should be noted that the IMD layer can comprise single level or multiple levels to surround and isolate the metal interconnection(s). For example, if the device was fabricated using three metal level processes, then the separated IMD layer would exist for each of the three metal levels (not shown). In order to simplify the illustration of the present invention, only two IMD levels 420 and 440 and two metal interconnections 410 and 430 are shown in FIG. 6, but this is not intended to limit the present invention.

In FIG. 6, a bonding metal layer 450 comprising a wire bonding portion 452 and an edge portion 454 is defined on the second IMD layer 440 above the second metal layer 430. The bonding metal layer 450 can be a Cu, Al, AlCu or AlSiCu layer formed by deposition. The bonding metal layer 450 connects to the second plugs 442 and the second metal damascene structure 644. A bonding pad structure of the present invention is thus obtained.

A passivation layer 460 overlies the surfaces of the bonding metal layer 450 and the IMD layer 440. The passivation layer 460 can be a SiN or SiON layer formed by CVD. An opening 465 is formed to expose the wire bonding portion 452 by photolithography and etching. Finally, a wire 470 (or a test fixture) is bonded to the wire bonding portion 452 of the bonding metal layer 450.

According to the second embodiment of the invention, with reference to FIG. 6, the passages for flowing ESD current are not only the known plugs (422/442) connecting the wiring layer (510/515) with a stripe layout, but also the conductive structure (i.e. the metal damascene structure 624/644) connecting the edge portion (520/525) of the metal layer (410/430/450). Thus, the present bonding pad structure can prevent burn out of the edge portion of the slotted metal layer during an ESD event.

Figure 5B:
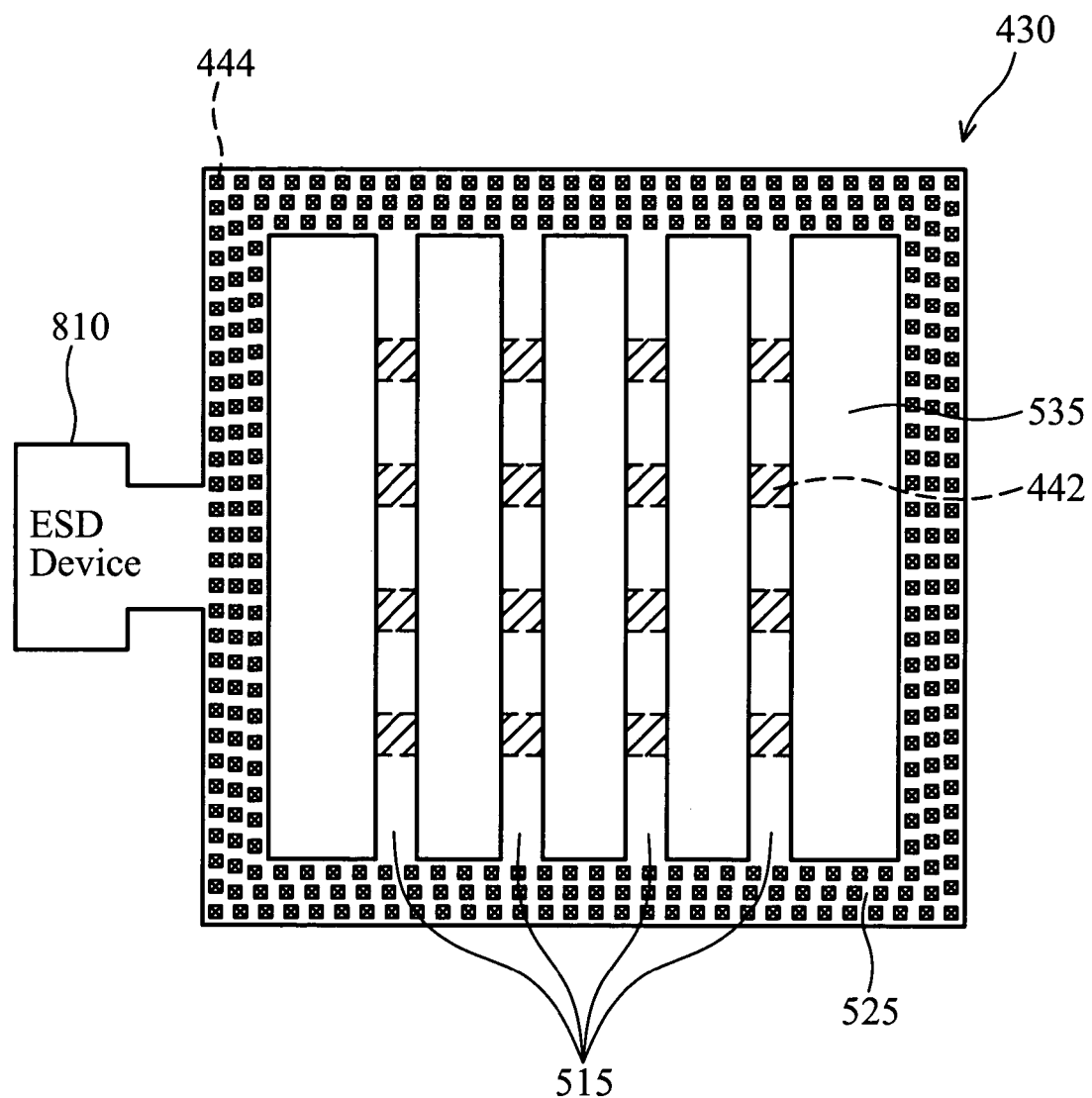
FIG. 5B shows a layout pattern (a top plan view) of another metal layer of the bonding pad structure shown in FIG. 4.
Figure 7B:
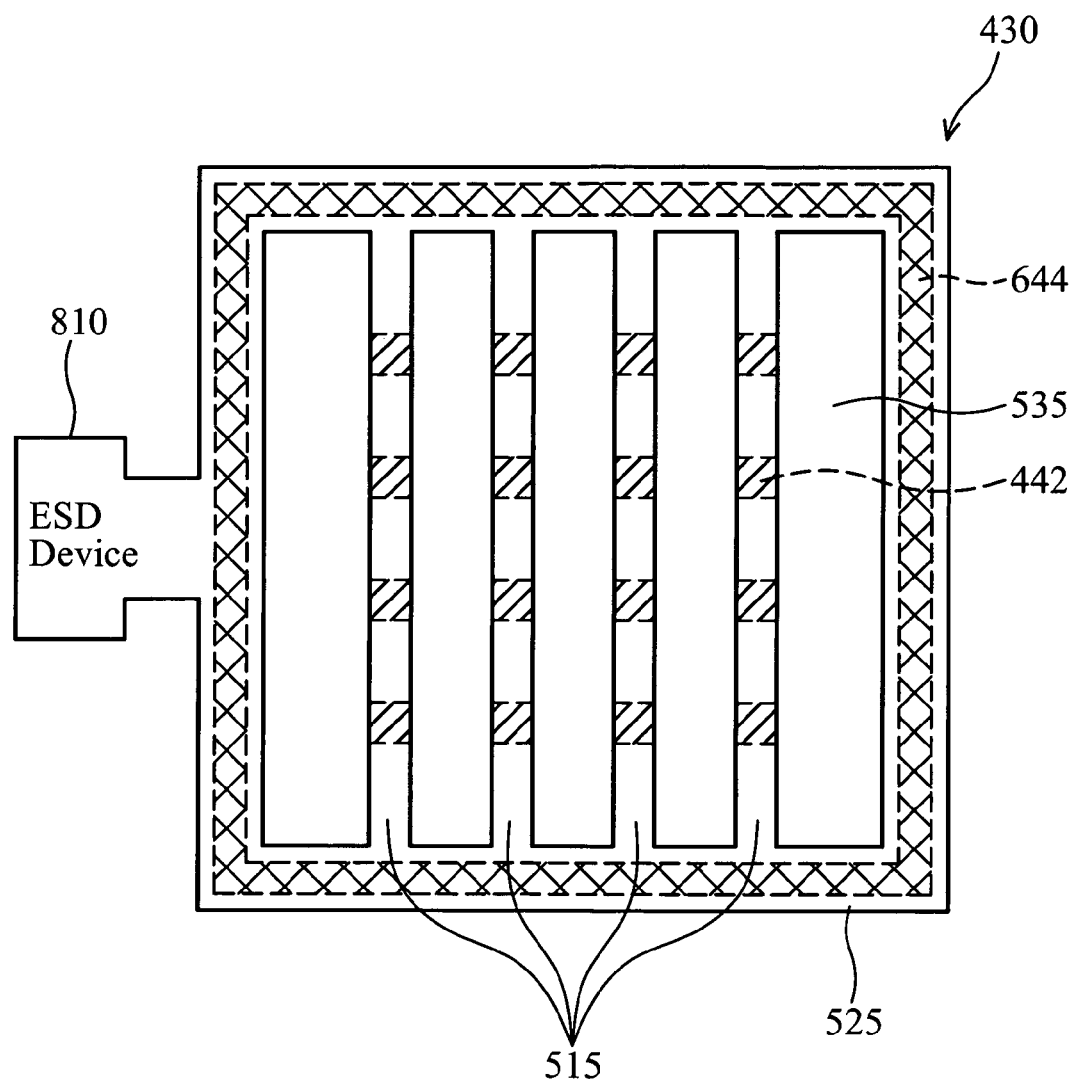
FIG. 7B shows a layout pattern (a top plan view) of another metal layer of the bonding pad structure shown in FIG. 6.

The ESD protection device 810 shown in FIGS. 5B and 7B comprises, for example, an NMOS device. The ESD protection device 810 is described in, for example, U.S. Patent Application Publication Nos. 2002/0079539, 2002/0093056 and 2002/0135032, and is therefore not discussed herein to avoid obscuring aspects of the present invention.

The present invention provides a bonding pad structure and fabrication method thereof. The present bonding pad structure includes a bonding pad substantially surrounded and insulated by a dielectric layer. The bonding pad comprises at least one first conductive layer having a wiring layer with a stripe layout and a first edge portion, a second conductive layer having a wire bonding portion and a second edge portion and a plurality of plugs electrically connecting the wiring layer and the wire bonding portion. A conductive structure of an array of metal plugs or a metal damascene structure connects the first edge portion and the second edge portion, thereby protecting the first edge portion from burn out during an ESD event and ameliorating the disadvantages of the conventional technology.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A bonding pad structure, comprising:
   a bonding pad substantially surrounded and insulated by a dielectric layer, wherein the bonding pad comprises at least one first conductive layer having a wiring layer with a stripe layout and a first edge portion, a second conductive layer having a wire bonding portion and a second edge portion and a plurality of plugs electrically connecting the wiring layer and the wire bonding portion; and
   an array of conductive structures surrounding the wire bonding portion, connecting the first edge portion and the second edge portion, wherein the conductive structures comprising a formation of at least two rows.

2. The structure according to claim 1, further comprising:
   an electrostatic discharge (ESD) protection device electrically connected to the first conductive layer.

3. The structure according to claim 1, wherein a material of the dielectric layer is a low dielectric constant material.

4. The structure according to claim 1, wherein the first conductive layer is a metal layer.

5. The structure according to claim 1, wherein the second conductive layer is a metal layer.

6. A bonding pad structure, comprising:
   a substrate having an interlevel dielectric (ILD) layer thereon,
   a bonding pad formed on the ILD layer and substantially surrounded and insulated by an intermetal dielectric (IMD) layer, wherein the bonding pad comprises at least one metal layer having a wiring layer with a stripe layout and a first edge portion, a bonding metal layer having a wire bonding portion and a second edge portion and a plurality of plugs electrically connecting the wiring layer and the wire bonding portion; and
   an array of conductive structures surrounding the wire bonding portion, connecting the first edge portion and the second edge portion, wherein the conductive structures comprising a formation of at least two rows.

7. The structure according to claim 6, further comprising:
   an electrostatic discharge (ESD) protection device electrically connected to the first conductive layer.

8. The structure according to claim 6, wherein a material of the IMD layer is a low dielectric constant material.

9. A bonding pad structure, comprising:
   a bonding pad substantially surrounded and insulated by a dielectric layer, wherein the bonding pad comprises at least one first conductive layer having a wiring layer with a stripe layout and a first edge portion, a second conductive layer having a wire bonding portion and a second edge portion and a plurality of first plugs electrically connecting the wiring layer and the wire bonding portion; and an array of second plugs connecting the first edge portion and the second edge portion, wherein each of the second plugs has a dimension smaller than one of each of the first plugs.

10. The structure according to claim 9, further comprising:
an electrostatic discharge (ESD) protection device electrically connected to the first conductive layer.

11. The structure according to claim 9, wherein a material of the dielectric layer is a low dielectric constant material.

12. The structure according to claim 9, wherein the first conductive layer is a metal layer.

13. The structure according to claim 9, wherein the first conductive layer is a metal layer.

* * * * *